US008520713B2

(12) United States Patent
Joseph

(10) Patent No.: US 8,520,713 B2
(45) Date of Patent: Aug. 27, 2013

(54) OPTICAL PUMPING OF SOLID-STATE LASER MATERIAL USING ADDRESSABLE LASER ARRAY

(75) Inventor: John R Joseph, Albuquerque, NM (US)

(73) Assignee: TriLumina Corporation, Albuquerque, NM (US)

( * ) Notice: Subject to any disclaimer, the term of this patent is extended or adjusted under 35 U.S.C. 154(b) by 0 days.

(21) Appl. No.: 13/300,531

(22) Filed: Nov. 18, 2011

(65) Prior Publication Data

US 2012/0128015 A1    May 24, 2012

Related U.S. Application Data

(60) Provisional application No. 61/415,765, filed on Nov. 19, 2010.

(51) Int. Cl.
*H01S 5/00*        (2006.01)

(52) U.S. Cl.
USPC ......... 372/50.122; 372/50.1; 372/75; 372/70; 372/41; 372/22; 372/21

(58) Field of Classification Search
USPC .............. 372/75, 70, 41, 22, 21, 50.122, 50.1
See application file for complete search history.

(56) References Cited

U.S. PATENT DOCUMENTS

| | | | |
|---|---|---|---|
| 5,353,295 | A | 10/1994 | Holonyak et al. |
| 5,513,203 | A | 4/1996 | Damen |
| 2004/0196875 | A1 | 10/2004 | Tayebati |
| 2005/0025211 | A1* | 2/2005 | Zhang et al. ................... 372/101 |
| 2006/0245460 | A1* | 11/2006 | Luo et al. ......................... 372/70 |
| 2007/0189350 | A1* | 8/2007 | Young et al. ............. 372/50.124 |
| 2008/0112443 | A1 | 5/2008 | Lee et al. |
| 2009/0238217 | A1 | 9/2009 | Moser et al. |
| 2010/0150186 | A1 | 6/2010 | Mizuuchi et al. |

* cited by examiner

*Primary Examiner* — Kinam Park
(74) *Attorney, Agent, or Firm* — Woodcock Washburn LLP

(57) ABSTRACT

An array of Surface Emitting Laser (SEL) elements can be used to efficiently pump a disk or rod of solid-state laser glass or crystal, or harmonic-generating crystal. Placing the laser array chip against or near the surface of this solid-state material provides very high and uniform optical power density without the need for lenses or fiber-optics to conduct the light from typical edge-emitting lasers, usually formed in a stack of bars. The lasers can operate in multi-mode output for highest output powers. Photolithography allows for an infinite variety of connection patterns of sub-groups of lasers within the array, allowing for spatial contouring of the optical pumping power across the face of the solid-state material. The solid-state material may be pumped either within (intra-cavity) or externally (extra-cavity) to the SEL laser array.

28 Claims, 3 Drawing Sheets

OPTICAL PUMPING OF SOLID-STATE LASER MATERIAL USING ADDRESSABLE LASER ARRAY

CROSS-REFERENCES TO RELATED APPLICATIONS

This application is a non-provisional application taking priority from U.S. Provisional Application No. 61/415,765, which is incorporated in its entirety herein by reference.

BRIEF DESCRIPTION

One or more arrays of addressable surface emitting lasers (SEL) optically pump solid-state laser devices using patterned pumping elements which have been divided into sub-arrays of elements individually addressable for the purpose of selecting and controlling regions of pumping intensity into the crystal or glass. When used in an end-pumping configuration, selective array elements can create a contour of pump power intensity in sub-regions of the material to lase and thereby control beam properties such as transverse profile and propagation direction. End-pumping with such SEL arrays also can facilitate intra-cavity pumping of the lasing material to provide much higher pumping intensities than extra-cavity pumping configurations.

STATEMENTS AS TO THE RIGHTS TO INVENTIONS MADE UNDER FEDERALLY SPONSORED RESEARCH OR DEVELOPMENT

Not applicable.

REFERENCE TO A "SEQUENCE LISTING," A TABLE, OR A COMPUTER PROGRAM LISTING APPENDIX SUBMITTED ON A COMPACT DISK

Not applicable.

BACKGROUND

A Diode-Pumped Solid-State (DPSS) laser uses a slab, cylinder or thin disk of doped solid-state lasing material, such as crystal or glass, and sometimes includes harmonic generation material as well. The optical pumping and conversion efficiency of solid-state laser materials is highly dependent upon the optical power density of the pump source, the wavelength match between the pump source and the lasing material, the thermal gradient across the lasing material, and the optical coupling to the lasing material. The transverse beam profile is a strong function of thermal effects in the lasing material and the distribution of the optical pump light across the cross-section of the resulting DPSS laser beam.

High power DPSS lasers are typically pumped using a bank of edge-emitting lasers which are either edge-coupled or face-coupled to the material. The bank of pump lasers is typically comprised of a stack of individual or arrayed edge-emitting laser diodes which have relatively large gaps between the lasers creating design limitations for controllable patterns. A prior art solution to this limitation involves aligning a lens and fiber optic combination to each laser in the stack, with the resulting bundle of fibers being collected and mounted to the face of the material. This solution, unfortunately, adds complexity, cost and size to the overall system. This solution is also impractical to implement in an external cavity arrangement because the edge-emitting lasers are mechanically aligned in the array stack and the planar alignment tolerance for an external mirror is extremely critical.

DETAILED DESCRIPTION

Figure 1:
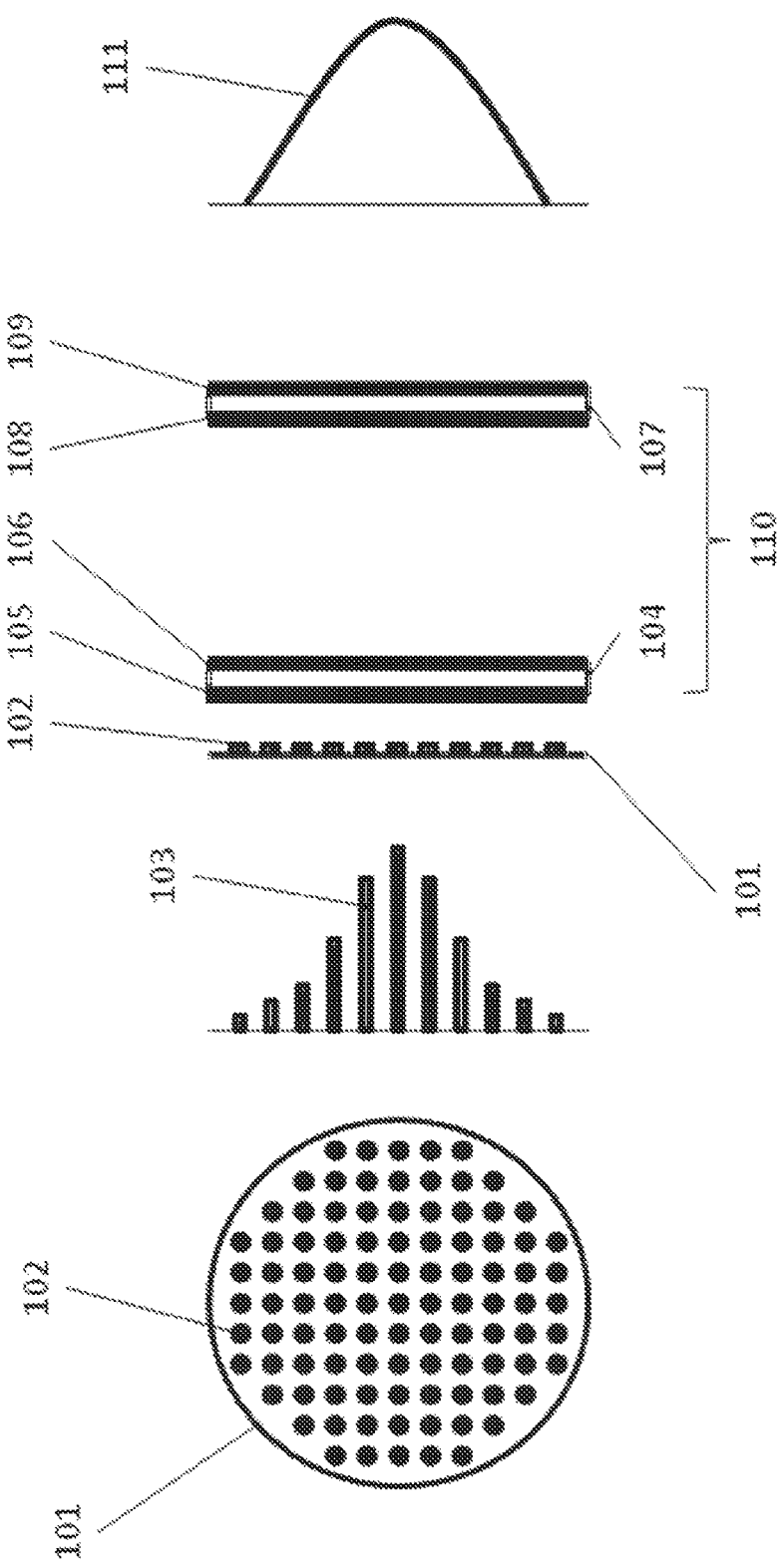
FIG. 1 is an illustration of an embodiment of a solid-state laser cavity which is pumped by an addressable SEL array chip which provides a radial profile of light intensity to the solid-state lasing material to control the intensity profile of the resulting single laser beam.

Embodiments include an array of addressable vertical-cavity surface-emitting laser (VCSEL) elements that are utilized to pump a solid-state laser material. Embodiments further include a monolithic and addressable array of VCSEL elements for controlling the intensity profile, size, shape and location of a multitude of elements for optically pumping solid-state materials to materially change the transverse beam profile, size, shape, and propagation direction of the resulting single laser beam, respectively. While two-dimensional arrays of edge-emitting laser diodes could be used as the laser source, the means to effectively couple their outputs to the solid-state material involves much more complexity, size and cost due to relatively poor beam shape quality and lower physical emitter packing factor. For example, edge emitters have a highly astigmatic beam with large divergence in one axis and low divergence in the other, causing complexity in the beam-shaping optics needed to couple the light onto a surface. Adjacent edge emitters cannot be assembled in nearly as close proximity to one another as VCSEL array elements. This leads to the use of fiber optic bundles to compress the edge-emitter array output to a tight grouping, further adding cost, size and complexity.

Embodiments include an array of Surface Emitting Laser (SEL) elements that are used to efficiently pump a disk or rod of solid-state laser glass or crystal, or harmonic-generating crystal. Placing the laser array chip against or near the surface of this solid-state material provides very high and uniform optical power density without the need for lenses or fiber-optics to conduct the light from typical edge-emitting lasers, usually formed in a stack of bars. The lasers can operate in multi-mode output for highest output powers. Photolithography allows for an infinite variety of connection patterns of sub-groups of lasers within the array, allowing for spatial contouring of the optical pumping power across the face of the solid-state material. The solid-state material may be pumped either within (intra-cavity) or externally (extra-cavity) to the SEL laser array.

In addition, because the output power of a VCSEL array scales better in terms of active area and packing factor, a monolithic array of a large number of small devices can be used, which is preferable to arrays of edge-emitting lasers, especially with regard to output power density and illumination uniformity across the illuminated surface of the solid-state material. With a VCSEL array in place, adding the ability to address either every element, or sub-groups of elements, enables the array to deliver new degrees of freedom in optical pumping of the solid-state material. The result is the conversion of the output from a multitude of optical sources to a single high quality beam with controllable or adaptive characteristics from a solid-state laser, effectively converting the high etendue (i.e., beam area times beam divergence solid angle) of a multitude of emitters into a low etendue of a single output beam with highly desirable beam properties.

The left side of FIG. 1 depicts a top view of a monolithic array 101 of VCSEL elements 102, which can be individually controlled or controlled in groups to further control the output intensity of the array so as to generate an output profile of element output intensities across the array 101, such as depicted in output profile 103. Many other output profiles are possible. The right side of FIG. 1 depicts a side view of the array 101 of VCSEL elements 102 in relation to the resonant cavity 110 of a solid-state laser, which is configured to generate a resulting solid-state laser beam profile 111 from the output profile 103. The resonant cavity 110 includes solid-state material 104 and cavity mirror 107. The solid-state material 104 has one or more optical coatings 105 that are transmissive to the pumping wavelength of elements 102, yet reflective to the solid-state wavelength, which is typically longer than that of the pumping wavelength. One or more optical coatings 106 also serve as a reflector to the pumping wavelength and are transmissive to the solid-state wavelength. Cavity mirror 107, which is typically concave, but not shown as such in FIG. 1, serves to complete the resonant cavity 110 of the solid-state laser with one or more coatings 108 that are reflective to the solid-state wavelength and one or more coatings 109, which serve as an output coupler with partial transmission to the solid-state wavelength.

When such an optically pumped solid-state cavity is used for intra-cavity harmonic generation, element 107 would be a harmonic-generating crystal material, where coatings 108 would be transmissive to the solid-state wavelength and reflective to the harmonic wavelength, while coatings 109 would be reflective to the solid-state wavelength, but partially transmissive to the harmonic wavelength. As noted, an example of the resulting solid-state laser beam profile is depicted in 111. Being able to control the transverse intensity profile of the optical pump array serves to compensate for thermal and optical distortions in the solid-state material as well as thermally-induced shifts in the VCSEL output wavelength or the solid-state laser material absorption wavelength, resulting in a higher quality output beam.

Figure 2:
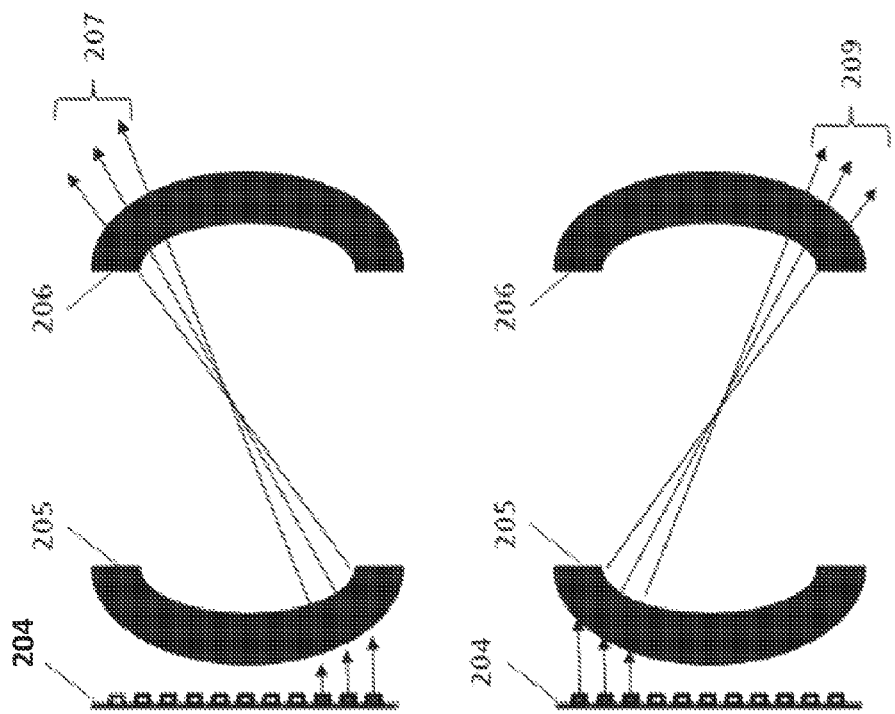
FIG. 2 is an illustration of an embodiment for moving the centroid of a sub-array of monolithic and addressable vertical-cavity surface-emitting laser (VCSEL) array chip to steer the beam propagation direction without need for moving parts.
Figure 2:
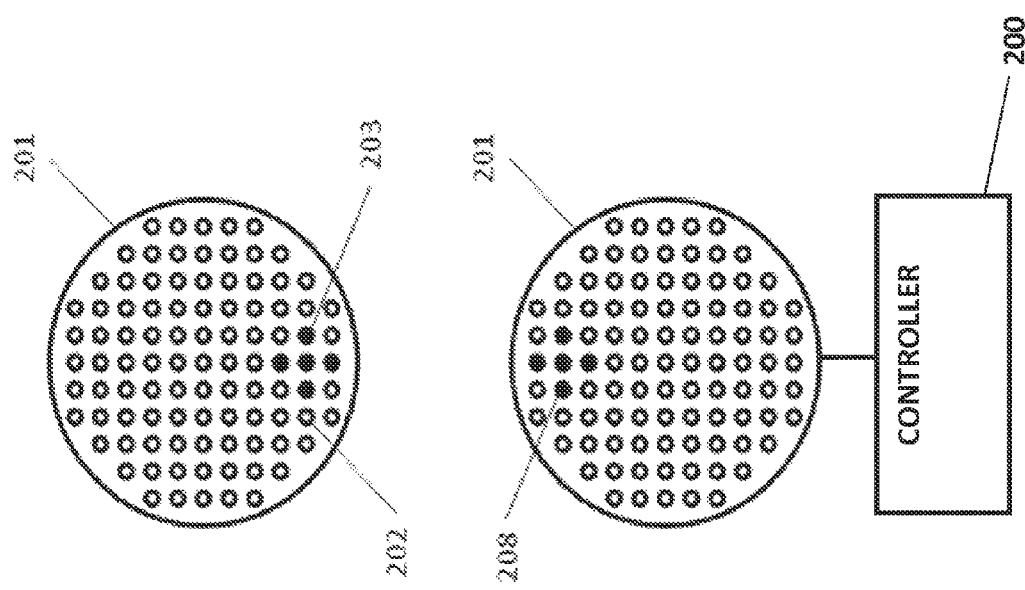

FIG. 2 depicts two different embodiments of control modes for changing the beam propagation direction from a solid-state laser cavity resonator, such as the monolithic array 101 described above. In FIG. 2, a controller 200 in communication with the monolithic array 201 of addressable VCSEL elements 202 can be used to activate single elements 202, or only small sub-regions or clusters of single elements 202, such as sub-regions 203 and 208. Edge-on views of array 201 are shown as array 204 in alignment with solid-state material 205 of a concentric resonator formed by material 205 and output coupler 206. When only a sub-region of solid-state material 205 is optically pumped by a sub-region of the array 204, such as sub-region 203, the beam waist is formed at the mid-point between 205 and 206 in such a way that it serves as a pivot-point for the beam 207 that exits output coupler 206. When sub-region 203 is moved, for example, to a different location, such as sub-region 208, the resulting solid-state laser beam 207 is correspondingly shifted and rotated, resulting in a new output beam direction 209. Being able to change the direction of a DPSS laser beam without use of mechanical devices has many advantages for beam scanning applications.

Figure 3:
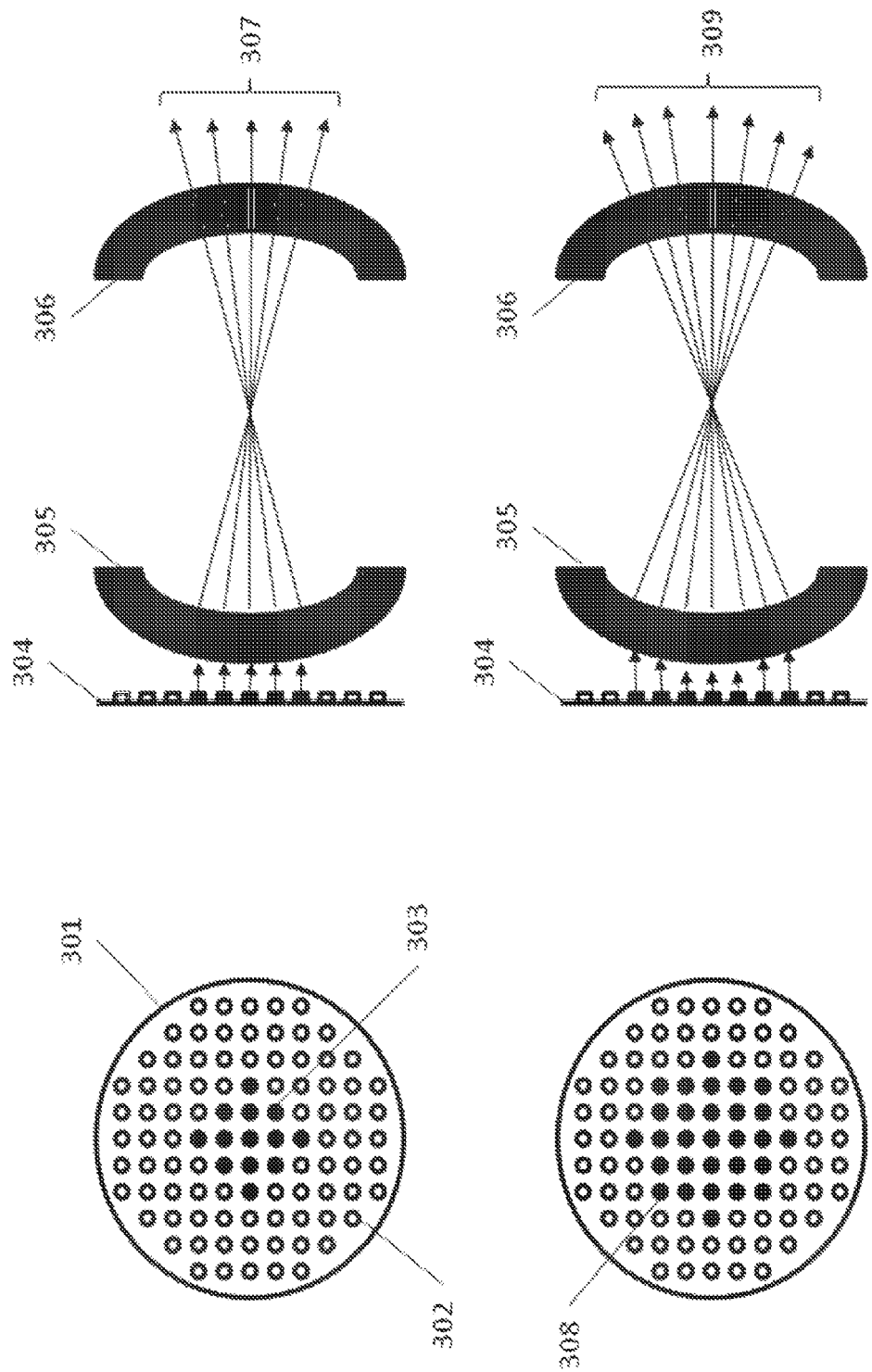
FIG. 3 is an illustration of an embodiment for controlling the size and/or shape of a sub-array of addressable VCSEL array chips to change the size and/or shape of the resulting laser beam.

FIG. 3 depicts two different embodiments of control modes for changing the size and/or the shape of a laser beam output from a solid-state laser cavity resonator. A monolithic array 301 of addressable VCSEL elements 302 can be used to activate only a small sub-region or cluster, such as sub-regions 303 and 308. Edge-on views of array 301 are shown as array 304. The size and/or shape of the activated VCSEL elements determines the activated sub-regions of the solid-state material 305, thereby controlling the corresponding size and/or shape of the resulting beam 307 or 309 from the solid-state resonator cavity formed by the combination of solid-state material 305 and output coupler mirror 306.

An embodiment includes a pumped solid-state laser comprising a solid-state lasing material and an addressable array of surface emitting lasers (SEL) elements arranged adjacent to the solid-state lasing material and configured to pump the solid-state lasing material to produce one or more laser beams as an output of the solid-state lasing material. In a further embodiment, the one or more SEL elements of the addressable array of SEL elements are configured to be addressed by a controller. In a further embodiment, a controller is configured to address one or more SEL elements of the addressable array of SEL elements to control an intensity profile of the one or more laser beams. In a further embodiment, a controller is configured to address one or more SEL elements of the addressable array of SEL elements to control a size of the one or more laser beams. In a further embodiment, a controller is configured to address one or more SEL elements of the addressable array of SEL elements to control a shape of the one or more laser beams. In a further embodiment, a controller is configured to address one or more SEL elements of the addressable array of SEL elements to control a propagation direction of the one or more laser beams. In a further embodiment, the addressable array of SEL elements is a monolithic array.

In a further embodiment, the solid-state lasing material having a first side facing the array of SEL elements including a first set of one or more optical coatings that are transmissible to a pumping wavelength of the array of SEL elements and reflective to a solid-state wavelength of the solid-state lasing material, the solid-state lasing material having a second side facing away from the array of SEL elements including a second set of one or more optical coatings that are transmissible to the solid-state wavelength and reflective to the pumping wavelength, and further comprising a cavity mirror placed adjacent to the second side of the solid-state lasing material, the cavity mirror having an input side including a third set of one or more optical coatings that are reflective to the solid-state wavelength and an output side including a fourth set of one or more optical coatings that are partially transmissive to the solid-state wavelength.

In a further embodiment, the solid-state lasing material having a first side facing the array of SEL element including a first set of one or more optical coatings that are transmissible to a pumping wavelength of the array of SEL elements and reflective to a solid-state wavelength of the solid-state lasing material, the solid-state lasing material having a second side facing away from the array of SEL elements including a second set of one or more optical coatings that are transmissible to the solid-state wavelength and reflective to the pumping wavelength, and further comprising a harmonic generating crystal material placed adjacent to the second side of the solid-state lasing material, the harmonic generating crystal material having an input side including a third set of one or more optical coatings that are transmissive to the solid-state wavelength and reflective to a harmonic wavelength of the harmonic generating crystal material and an output side including a fourth set of one or more optical coatings that are reflective to the solid-state wavelength and partially transmissive to the harmonic wavelength.

An embodiment includes a method for enhancing transverse beam quality of a laser beam, comprising the steps of arranging a monolithic and addressable array of surface emitting lasers (SEL) elements adjacent to the solid state lasing material and controlling a radial intensity profile of pumping power or emitted wavelength of a combined output of the array of SEL elements into the solid state lasing material by varying an output of one or more concentric rings of SEL elements within the array of SEL elements to control an output power density and an illumination uniformity across the solid state lasing material.

An embodiment includes a pumped solid-state laser comprising a monolithic and addressable array of surface emitting laser (SEL) elements and a solid state lasing material, wherein the array of SEL elements is arranged adjacent to the solid state lasing material, the array of SEL elements including one or more concentric rings of SEL elements, each of the one or more concentric rings of SEL elements having a variable output configured to control a radial intensity profile of pumping power or emitted wavelength of a combined output of the array of SEL elements and thereby controlling an output power density and an illumination uniformity across the solid state lasing material.

An embodiment includes a method for controlling a direction of beam propagation of a laser beam output by a solid state laser including solid-state lasing material comprising the steps of arranging a monolithic and addressable array of surface emitting laser (SEL) elements adjacent to the solid state lasing material, wherein the array of SEL elements includes one or more sub-regions of SEL elements and activating the one or more sub-regions of SEL elements to selectively pump one or more sub-regions of the solid state lasing material and to control the direction of beam propagation of the laser beam.

An embodiment includes a pumped solid-state laser comprising a monolithic and addressable array of surface emitting laser (SEL) elements and a solid-state lasing material, wherein the array of SEL elements is arranged adjacent to the solid-state lasing material, the array of SEL elements including one or more sub-regions of SEL element, each of the one or more sub-regions of SEL elements selectively activated by a controller to pump one or more sub-regions of the solid-state lasing material to control a direction of beam propagation of one or more laser beams output by the solid-state lasing material.

An embodiment includes a method for controlling a size or shape of a laser beam output by a solid-state laser comprising the steps of arranging an addressable array of surface emitting laser (SEL) elements adjacent to the solid-state lasing material, wherein the array of SEL elements including one or more sub-regions of SEL elements and activating the one or more sub-regions of SEL elements to selectively pump one or more sub-regions of the solid-state lasing material and to control a size or shape of an optically-active region of the solid-state material so as to control an aperture of the laser beam to the size or shape desired.

An embodiment includes a pumped solid-state laser comprising a monolithic and addressable array of surface emitting laser (SEL) elements and a solid state lasing material, wherein the array of VCSEL elements is arranged adjacent to the solid-state lasing material, the array of SEL elements including one or more sub-regions of SEL elements, each of the one or more sub-regions of SEL elements selectively activated by a controller to pump one or more optically-active sub-regions of the solid-state lasing material to control an aperture of one or more laser beams output by the solid-state lasing material to a desired size or shape.

While a number of embodiments have been illustrated and described herein, along with several alternatives and combinations of various elements, for use in end-pumping of solid-state laser cavity resonators, it is to be understood that the embodiments described herein are not limited to the embodiments shown and can have a multitude of additional uses and applications. Accordingly, the embodiments should not be limited to just the particular descriptions, variations and drawing figures contained in this specification, which merely illustrate a preferred embodiment and several alternative embodiments.

What is claimed is:

1. A pumped solid-state laser, comprising:
   a solid-state lasing material, the solid-state lasing material having a first side facing an addressable array of surface emitting laser (SEL) elements including a first set of one or more optical coatings that are transmissible to a pumping wavelength of the array of SEL elements and reflective to a solid-state wavelength of the solid-state lasing material, the solid-state lasing material having a second side facing away from the array of SEL elements including a second set of one or more optical coatings that are transmissible to the solid-state wavelength and reflective to the pumping wavelength;
   a cavity mirror placed adjacent to the second side of the solid-state lasing material, the cavity mirror having an input side including a third set of one or more optical coatings that are transmissive to the solid-state wavelength and an output side including a fourth set of one or more optical coatings that are partially transmissive to the solid-state wavelength; and
   the addressable array of SEL elements being arranged adjacent to the solid-state lasing material and configured to pump the solid-state lasing material to produce one or more laser beams as an output of the solid-state lasing material.

2. The pumped solid-state laser as recited in claim 1, wherein one or more SEL elements of the addressable array of SEL elements are configured to be addressed by a controller.

3. The pumped solid-state laser as recited in claim 1, wherein a controller is configured to address one or more SEL elements of the addressable array of SEL elements to control an intensity profile of the one or more laser beams.

4. The pumped solid-state laser as recited in claim 1, wherein a controller is configured to address one or more SEL elements of the addressable array of SEL elements to control a size of the one or more laser beams.

5. The pumped solid-state laser as recited in claim 1, wherein a controller is configured to address one or more SEL elements of the addressable array of SEL elements to control a shape of the one or more laser beams.

6. The pumped solid-state laser as recited in claim 1, wherein a controller is configured to address one or more SEL elements of the addressable array of SEL elements to control a propagation direction of the one or more laser beams.

7. The pumped solid-state laser as recited in claim 1, wherein the addressable array of SEL elements is a monolithic array.

8. A pumped solid-state laser, comprising:
   a solid-state lasing material, the solid-state lasing material having a first side facing an array of SEL elements including a first set of one or more optical coatings that are transmissible to a pumping wavelength of the array of SEL elements and reflective to a solid-state wavelength of the solid-state lasing material, the solid-state lasing material having a second side facing away from the array of SEL elements including a second set of one or more optical coatings that are transmissible to the solid-state wavelength and reflective to the pumping wavelength;

a harmonic generating crystal material placed adjacent to the second side of the solid-state lasing material, the harmonic generating crystal material having an input side including a third set of one or more optical coatings that are transmissive to the solid-state wavelength and reflective to a harmonic wavelength of the harmonic generating crystal material and an output side including a fourth set of one or more optical coatings that are reflective to the solid-state wavelength and partially transmissive to the harmonic wavelength; and the addressable array of SEL elements being arranged adjacent to the solid-state lasing material and configured to pump the solid-state lasing material to produce one or more laser beams as an output of the solid-state lasing material.

9. A method for enhancing transverse beam quality of a laser beam, comprising the steps of:

arranging a monolithic and addressable array of surface emitting lasers (SEL) elements adjacent to a solid state lasing material, the solid-state lasing material having a first side facing an addressable array of SEL elements including a first set of one or more optical coatings that are transmissible to a pumping wavelength of the array of SEL elements and reflective to a solid-state wavelength of the solid-state lasing material, the solid-state lasing material having a second side facing away from the array of SEL elements including a second set of one or more optical coatings that are transmissible to the solid-state wavelength and reflective to the pumping wavelength;

arranging a cavity mirror adjacent to the second side of the solid-state lasing material, the cavity mirror having an input side including a third set of one or more optical coatings that are transmissive to the solid-state wavelength and an output side including a fourth set of one or more optical coatings that are partially transmissive to the solid-state wavelength; and controlling a radial intensity profile of pumping power or emitted wavelength of a combined output of the addressable array of SEL elements into the solid state lasing material by varying an output of one or more concentric rings of SEL elements within the addressable array of SEL elements to control an output power density and an illumination uniformity across the solid state lasing material.

10. A pumped solid-state laser, comprising:

a monolithic and addressable array of surface emitting laser (SEL) elements;

a solid state lasing material, wherein the addressable array of SEL elements is arranged adjacent to the solid state lasing material, the addressable array of SEL elements including one or more concentric rings of SEL elements, each of the one or more concentric rings of SEL elements having a variable output configured to control a radial intensity profile of pumping power or emitted wavelength of a combined output of the addressable array of SEL elements and thereby controlling an output power density and an illumination uniformity across the solid state lasing material, the solid-state lasing material having a first side facing the addressable array of SEL elements including a first set of one or more optical coatings that are transmissible to a pumping wavelength of the array of SEL elements and reflective to a solid-state wavelength of the solid-state lasing material, the solid-state lasing material having a second side facing away from the array of SEL elements including a second set of one or more optical coatings that are transmissible to the solid-state wavelength and reflective to the pumping wavelength; and a cavity mirror placed adjacent to the second side of the solid-state lasing material, the cavity mirror having an input side including a third set of one or more optical coatings that are transmissive to the solid-state wavelength and an output side including a fourth set of one or more optical coatings that are partially transmissive to the solid-state wavelength.

11. A method for enhancing transverse beam quality of a laser beam, comprising the steps of:

arranging a monolithic and addressable array of surface emitting lasers (SEL) elements adjacent to a solid state lasing material, the solid-state lasing material having a first side facing an array of SEL elements including a first set of one or more optical coatings that are transmissible to a pumping wavelength of the array of SEL elements and reflective to a solid-state wavelength of the solid-state lasing material, the solid-state lasing material having a second side facing away from the array of SEL elements including a second set of one or more optical coatings that are transmissible to the solid-state wavelength and reflective to the pumping wavelength;

arranging a harmonic generating crystal material adjacent to the second side of the solid-state lasing material, the harmonic generating crystal material having an input side including a third set of one or more optical coatings that are transmissive to the solid-state wavelength and reflective to a harmonic wavelength of the harmonic generating crystal material and an output side including a fourth set of one or more optical coatings that are reflective to the solid-state wavelength and partially transmissive to the harmonic wavelength; and controlling a radial intensity profile of pumping power or emitted wavelength of a combined output of the addressable array of SEL elements into the solid state lasing material by varying an output of one or more concentric rings of SEL elements within the addressable array of SEL elements to control an output power density and an illumination uniformity across the solid state lasing material.

12. The method as recited in claim 11, further comprising: addressing one or more SEL elements of the addressable array of SEL elements by a controller.

13. The method as recited in claim 11, further comprising: addressing one or more SEL elements of the addressable array of SEL elements to control an intensity profile of the one or more laser beams by a controller.

14. The method as recited in claim 11, further comprising: addressing one or more SEL elements of the addressable array of SEL elements to control a shape of the one or more laser beams by a controller.

15. A pumped solid-state laser, comprising:

a monolithic and addressable array of surface emitting laser (SEL) elements;

a solid state lasing material, wherein the addressable array of SEL elements is arranged adjacent to the solid state lasing material, the addressable array of SEL elements including one or more concentric rings of SEL elements, each of the one or more concentric rings of SEL elements having a variable output configured to control a radial intensity profile of pumping power or emitted wavelength of a combined output of the addressable array of SEL elements and thereby controlling an output power density and an illumination uniformity across the solid state lasing material, the solid-state lasing material having a first side facing the array of SEL element including a first set of one or more optical coatings that are transmissible to a pumping wavelength of the array of SEL elements and reflective to a solid-state wavelength of the solid-state lasing material, the solid-state lasing material having a second side facing away from the array of SEL elements including a second set of one or more optical coatings that are transmissible to the solid-state wavelength and reflective to the pumping wavelength; and a harmonic generating crystal material placed adjacent to the second side of the solid-state lasing material, the harmonic generating crystal material having an input side including a third set of one or more optical coatings that are transmissive to the solid-state wavelength and reflective to a harmonic wavelength of the harmonic generating crystal material and an output side including a fourth set of one or more optical coatings that are reflective to the solid-state wavelength and partially transmissive to the harmonic wavelength.

16. The pumped solid-state laser as recited in claim 1, wherein one or more SEL elements of the addressable array of SEL elements are configured to be addressed by a controller.

17. The pumped solid-state laser as recited in claim 1, wherein a controller is configured to address one or more SEL elements of the addressable array of SEL elements to control an intensity profile of the one or more laser beams.

18. The pumped solid-state laser as recited in claim 1, wherein a controller is configured to address one or more SEL elements of the addressable array of SEL elements to control a shape of the one or more laser beams.

19. The pumped solid-state laser as recited in claim 8, wherein one or more SEL elements of the addressable array of SEL elements are configured to be addressed by a controller.

20. The pumped solid-state laser as recited in claim 8, wherein a controller is configured to address one or more SEL elements of the addressable array of SEL elements to control an intensity profile of the one or more laser beams.

21. The pumped solid-state laser as recited in claim 8, wherein a controller is configured to address one or more SEL elements of the addressable array of SEL elements to control a shape of the one or more laser beams.

22. The pumped solid-state laser as recited in claim 8, wherein the array of SEL elements is a monolithic array.

23. The method as recited in claim 9, further comprising:
addressing one or more SEL elements of the addressable array of SEL elements by a controller.

24. The method as recited in claim 9, further comprising:
addressing one or more SEL elements of the addressable array of SEL elements to control an intensity profile of the one or more laser beams by a controller.

25. The method as recited in claim 9, further comprising:
addressing one or more SEL elements of the addressable array of SEL elements to control a shape of the one or more laser beams by a controller.

26. The pumped solid-state laser as recited in claim 10, wherein one or more SEL elements of the addressable array of SEL elements are configured to be addressed by a controller.

27. The pumped solid-state laser as recited in claim 10, wherein a controller is configured to address one or more SEL elements of the addressable array of SEL elements to control an intensity profile of the one or more laser beams.

28. The pumped solid-state laser as recited in claim 10, wherein a controller is configured to address one or more SEL elements of the addressable array of SEL elements to control a shape of the one or more laser beams.

* * * * *